(12) United States Patent
Rasband

(10) Patent No.: US 6,198,393 B1
(45) Date of Patent: Mar. 6, 2001

(54) FOIL/INK COMPOSITE INDUCTOR

(75) Inventor: Paul Brent Rasband, Frederick, MD (US)

(73) Assignee: Westvaco Corporation, New York, NY (US)

( * ) Notice: Subject to any disclaimer, the term of this patent is extended or adjusted under 35 U.S.C. 154(b) by 0 days.

(21) Appl. No.: 09/499,118

(22) Filed: Feb. 7, 2000

(51) Int. Cl.⁷ .................................................. G08B 13/14
(52) U.S. Cl. ........................................ 340/572.5; 29/602.1
(58) Field of Search ...................... 340/572.5; 29/602.1; 428/901; 427/96; 336/200

(56) References Cited

U.S. PATENT DOCUMENTS

| | | | |
|---|---|---|---|
| 4,835,524 | 5/1989 | Lamond et al. | 340/572.3 |
| 5,442,334 | 8/1995 | Gallo et al. | 340/572.3 |
| 5,445,922 * | 8/1995 | Maple | 427/96 X |
| 5,532,667 * | 7/1996 | Haertling et al. | 336/177 |
| 5,781,110 | 7/1998 | Habeger, Jr. et al. | 340/572.5 |

* cited by examiner

*Primary Examiner*—Thomas Mullen

(57) ABSTRACT

A continuous loop inductor for an RF-EAS security tag comprises a plurality of discrete, unconnected foil loop segments connected together by conductive ink patches.

5 Claims, 1 Drawing Sheet

FOIL/INK COMPOSITE INDUCTOR

BACKGROUND OF INVENTION

The present invention relates to the preparation of a continuous loop inductor for a RF-EAS resonant security tag circuit useful in conjunction with an electronic security system.

Presently there are two basic types of RF-EAS security tags commercially available. One type is a reusable tag which can be fastened to the products desired to be protected, while the other is of the disposable type that can be adhered to the packaging in which the products are packaged, or prepared as a part of the packaging material itself. These tags utilize technology based on tuned circuits that operate in the radio frequency range. An example of the disposable type is disclosed in applicant's pending U.S. patent application Ser. No. 09/362,614, assigned to the present assignee herein.

The disposable tags use discrete inductor and capacitor elements that are applied to a dielectric substrate. Such elements may be formed by conventional fabrication methods for forming printed circuits including selected use of laminated substrates having an interior dielectric layer laminated on both surfaces with a conductive composition such as aluminum or copper. The conductive layers may be printed with an etchant resistant material in the form of the desired circuit, and after etching, the remaining conductive material forms the desired circuit. Alternatively, the resonant tag circuits can be formed by an additive process whereby an activatable composition is printed on a dielectric substrate in the form of the desired circuit. Likewise, the circuits can be formed by stamping or die cutting the circuits out of thin metal sheets which are then adhered or laminated to the dielectric substrate. Efforts to print inductor loops using conductive inks are disclosed for example in U.S. Pat. Nos. 5,442,334 and 5,781,110. However, conductive inks generally have a resistivity nearly one order of magnitude greater than solid metals such as aluminum. Likewise, the fabrication of inductor elements using die-stamping techniques (or, alternatively, die-cutting and subsequent transfer), especially of an inductor foil containing many thin loops, is a difficult and exacting process since fracture of the loop at any point results in an open circuit and ineffective inductor. Thus there remains a need in the art to develop a method and or technique to successfully apply inductors to substrates in the fabrication of RF-EAS security tags.

SUMMARY OF INVENTION

RF-EAS (Radio Frequency-Electronic Article Surveillance) circuits are often comprised of a single inductor and capacitor in a loop, forming an LC resonant circuit. The production of LC circuits with sharp (i.e., frequency-specific) resonance requires that L/C (the Q factor) be as great as possible, which generally requires inductors with a large number of loops. Also, the total surface area occupied by the circuit is usually required to be as small as possible so that the EAS tag is not noticeable or obtrusive. These two requirements encourage the use of inductors with thin, tightly spaced loops. Another requirement of the inductor is that its electrical resistance be kept as low as possible. This requirement is best met by using solid metal foils rather than printed or hot-stamp pigmented materials. Moreover, as noted before, die-stamping of inductors containing many thin loops is a difficult and tricky process. Thus, in an effort to overcome these problems, the present invention comprises a composite foil/ink inductor element which incorporates the best features of each process. For this purpose, the inductor element according to the present invention is comprised of a plurality of discrete, unconnected foil loop segments, the ends of which are connected by printing conductive ink patches to form a continuous loop. It is known, for example, as shown in U.S. Pat. No. 4,835,524, to leave a gap in an inductor loop which is later closed with a conductive ink patch to provide a fusible link in the loop for the purpose of deactivating an RF-EAS tag. However, in the present invention, the purpose of the conductive ink patches is to close the gaps in a discontinuous inductor loop made up of segments of a metal foil to produce an active tag.

In accordance with the present invention, the inductor loop combines metal foil and conductive ink in a way that allows easier stamping and transfer of the foil, while minimizing the portion of the total inductor path length occupied by conductive ink rather than solid foil. The stamped (solid foil) portions of the inductor loop comprise essentially discrete, linear segments of foil. When these segments are stamped onto a suitable dielectric substrate, and the waste foil removed, the ends of the waste foil are self-supporting thus reducing the chance for a rip or tear between the excess foil removed and the segment that remains on the substrate. The inductor loop is then made continuous by printing a conductive ink patch between the free ends of each foil segment. The composite foil/ink inductor of the present invention may be used in all situations which would normally employ a solid foil inductor, including, but not limited to, LC circuits employed in EAS security tags or as the inductor/antenna element of transponder units used in "smart cards" (e.g., phone cards, banking cards, security clearance cards, etc.).

DETAILED DESCRIPTION

Figure 1:
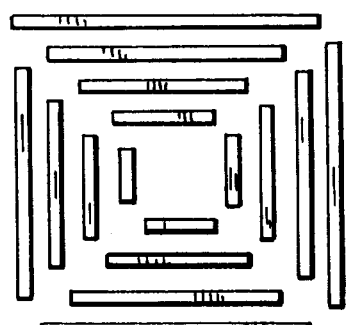
FIG. 1 is a plan view of the first step in making the inductor element of the present invention illustrating the discrete segments of the inductor loop.
Figure 2:
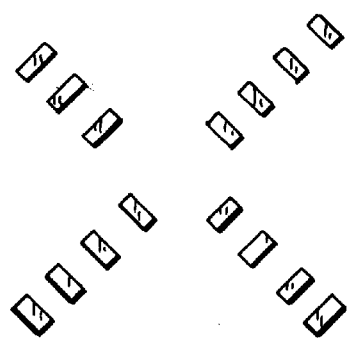
FIG. 2 shows the conductive ink printing pattern that is applied over the segments of FIG. 1; and, FIG. 3 is a plan view of the completed continuous inductor loop.
Figure 3:
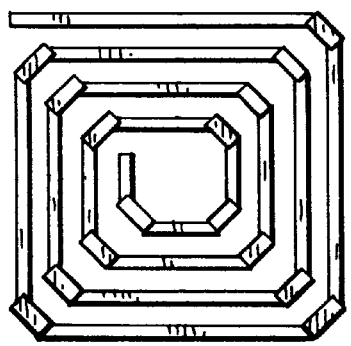

A prototype inductor element like the inductor element shown in FIG. 3 was produced using a die-stamping process with 1.5 mil "0" temper aluminum foil (Arclad S-6587 from Adhesive Research, Inc.), and 112-S silver metallic conductive paste (ink) from Electroscience Laboratories, Inc. After connecting the inductor so formed to a variable air capacitor and adjusting C in the resulting LC circuit, a resonance frequency of 8.0 MHz was obtained, as measured by a hand-held dip meter. The C value required for this resonance frequency was 0.13 nF (as measured by a handheld multimeter).

The resistance around the total inductor (all 6 loops) was 1.4 ohms. This result compares with a resistance of 0.6 ohms for an all-foil inductor of the same size and shape. If the identical inductor were printed using the aforementioned silver metallic paste, the resistance would be approximately 20 ohms to produce a Q factor 10–15 times less than the Q factor for the present invention. Accordingly, it may be seen that the composite foil/ink inductor of the present invention provides a suitable and highly reliable substitute for an all-foil inductor or a printed inductor.

It should be evident that the present invention may be implemented with various circuits other than the one shown to accomplish the intended purpose. Thus the present invention is not intended to be limited by what has been particularly shown and described except insofar as dictated by the scope of the appended claims.

What is claimed is:

1. The method for forming an inductor element for an RF-EAS security tag on a substrate comprising the steps:
    (a) selecting a dielectric substrate suitable for use as an RF-EAS tag;
    (b) applying an inductor element to the substrate in the form of segments of an inductor loop in a discontinuous manner; and,
    (c) connecting the ends of the segments of the inductor element to form a continuous inductor loop.

2. The method of claim 1 wherein the dielectric substrate of step (a) is selected from the group comprising paperboard, film or combinations thereof.

3. The method of claim 2 wherein the inductor loop segments of step (b) are selected from the group comprising foil strips of aluminum or, copper stamped on the substrate.

4. The method of claim 3 wherein the connecting means of step (c) comprises a printing step using an electrically conductive ink.

5. A combination foil/ink inductor element for an RF-EAS security tag comprising a continuous inductor loop consisting essentially of a plurality of foil loop segments applied to a dielectric substrate in the form of discontinuous, discrete strips of conductive foil wherein the ends of the foil loop segments are connected together to form a continuous loop with patches of an electrically conductive ink.

* * * * *